US008338303B2

(12) United States Patent
Kamimura

(10) Patent No.: US 8,338,303 B2
(45) Date of Patent: Dec. 25, 2012

(54) POLISHING LIQUID

(75) Inventor: Tetsuya Kamimura, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 441 days.

(21) Appl. No.: 12/639,015

(22) Filed: Dec. 16, 2009

(65) Prior Publication Data

US 2010/0167547 A1 Jul. 1, 2010

(30) Foreign Application Priority Data

Dec. 25, 2008 (JP) ................................ 2008-330704

(51) Int. Cl.
*H01L 21/302* (2006.01)

(52) U.S. Cl. .............. 438/693; 216/37; 216/67; 216/88; 252/79.1; 252/79.2; 252/79.3; 252/79.4; 438/689; 438/690; 438/691; 438/692

(58) Field of Classification Search .................... 216/37, 216/67, 88; 252/79.1–79.4; 438/689–692
See application file for complete search history.

(56) References Cited

U.S. PATENT DOCUMENTS

| | | | | |
|---|---|---|---|---|
| 7,183,211 | B2 * | 2/2007 | Konno et al. | 438/691 |
| 8,083,964 | B2 * | 12/2011 | Yamada et al. | 216/88 |
| 2006/0249482 | A1 * | 11/2006 | Wrschka et al. | 216/88 |
| 2007/0181534 | A1 * | 8/2007 | Kamimura | 216/88 |

FOREIGN PATENT DOCUMENTS

| | | | |
|---|---|---|---|
| JP | 2000-084832 | A | 3/2000 |
| JP | 2003-017446 | A | 1/2003 |
| JP | 2003-142435 | A | 5/2003 |
| JP | 2008-078233 | A | 4/2008 |

* cited by examiner

*Primary Examiner* — Lan Vinh
*Assistant Examiner* — Maki Angadi
(74) *Attorney, Agent, or Firm* — SOLARIS Intellectual Property Group, PLLC

(57) ABSTRACT

A polishing liquid for a chemical mechanical polishing of a semiconductor device includes (a) a carboxylic acid compound having one or more carboxy groups, (b) colloidal silica particles having a ζ potential of −10 mV to −35 mV when used in the polishing liquid, (c) a benzotriazole derivative, (d) an anionic surfactant, and (e) an oxidizing agent, and the polishing liquid has a pH of from 5.0 to 8.0.

16 Claims, No Drawings

POLISHING LIQUID

CROSS-REFERENCE TO RELATED APPLICATION

This application claims priority under 35 USC 119 from Japanese Patent Application No. 2008-330704 filed on Dec. 25, 2008, the disclosure of which is incorporated by reference herein.

BACKGROUND OF THE INVENTION

1. Field of the Invention

The present invention relates to a polishing liquid employed in a manufacturing process for a semi-conductor device. More specifically, the present invention relates to a polishing liquid which is preferably employed to polish a barrier layer consisting mainly of a barrier metallic material and an insulating layer consisting of an insulating material, for planarizing during a process for forming wiring on a semi-conductor device.

2. Related Art

In recent years, in the development of semi-conductor devices such as semi-conductor integrated circuits (hereinafter, referred to as "LSI"), increased density and integration have been sought by reducing the thickness of wiring and creating multiple layers thereof in order to miniaturize and increase the speeds of such devices. Moreover, various types of technologies, such as chemical mechanical polishing (hereinafter, referred to as "CMP") and the like have been employed in order to achieve this objective. CMP is an essential technology for surface planarization of processed layers, such as an inter-layer dielectric, for plug formation, for formation of embedded metal wiring, and the like. CMP performs smoothing of a substrate and eliminates excessive metallic thin films from wiring formation, and eliminates excessive barrier layer on the surface of insulating films.

A conventional method of CMP is a method in which a polishing pad is fixed to the surface of a circular polishing table (polishing platen), the surface of the polishing pad is impregnated with a polishing liquid, the surface of the substrate (wafer) is pressed onto the pad, and both the polishing platen and the wafer are rotated while a predetermined amount of pressure (polishing pressure) is applied from the backsides thereof, such that the surface of the wafer is thereby planarized via the mechanical abrasion produced therefrom.

When semi-conductor devices such as LSIs are produced, fine wiring is formed in multiple wiring layers, and a barrier metal such as of Ta, TaN, Ti or TiN is pre-formed in order to prevent diffusion of the wiring material into an inter-layer dielectric, and in order to improve adhesion of the wiring material, when forming the metal wiring, such as copper wiring, in each of these layers.

In order to form each wiring layer, in general, a CMP process on metallic film (hereinafter, referred to as "metallic film CMP") is first performed at a single stage or at multiple stages to remove excess wiring material that has been deposited by plating or the like, and thereafter, a CMP process is carried out to remove barrier metal material (barrier metal) that has been exposed on the surface of the metallic film (hereinafter, referred to as "barrier metal CMP"). However, metallic film CMP may cause over-polishing, referred to as dishing, or cause erosion of the wiring portions.

In order to reduce such dishing, in such barrier metal CMP, which follows the metallic film CMP, a wiring layer should be formed in which level differences due to dishing, erosion, and the like are ultimately reduced by regulating the polishing rate of the metal wiring portion and the polishing rate of the barrier metal portion. Specifically, in barrier metal CMP, it is preferable that the polishing rates of the barrier metal and insulation layer are moderately high, since dishing due to over-polishing of the wiring portion and erosion resulting from dishing may occur when the polishing rates of the barrier metal and the inter-layer dielectric are relatively low when compared with to the polishing rate of the metal wiring material. Not only does this have the advantage of improving the barrier metal CMP throughput, but there is a requirement to relatively increase the polishing rates of the barrier metal and the insulation layer for the above reasons, since dishing is often caused by metallic film CMP in practice.

A metal polishing liquid employed in CMP generally includes abrasive particles (for example, aluminum oxide or silica) and an oxidizing agent (for example, hydrogen peroxide or persulfuric acid). The basic polishing mechanism is thought to be that the metal surface is oxidized with the oxidizing agent, and then the oxide film formed thereby is removed with the abrasive particles.

However, when a polishing liquid including these sorts of solid abrasive particles is used in a CMP process, problems such as polishing damage (scratching), a phenomenon in which the entire polishing surface is over-polished (thinning), a phenomenon in which the polished metallic surface is dished (dishing), and a phenomenon in which plural metallic wiring surfaces are dished due to over-polishing of the insulator placed between the metallic wiring layers (erosion), and the like, may occur.

In addition, there are cost-related problems, such as complicating a conventionally employed cleaning process for eliminating residual polishing liquid from a semi-conductor surface when a polishing liquid including solid abrasive particles is used, and such as the requirement that solid abrasive particles must be precipitated when disposing of liquid after such cleaning (waste liquid).

The following investigations have been conducted with regard to a polishing liquid including solid abrasive particles.

For example, a CMP polishing agent and a polishing method that aim to achieve a high polishing rate, with virtually no occurrence of scratching is proposed (for example, Japanese Patent Application Laid-Open (JP-A) No. 2003-17446), a polishing composition and a polishing method for improving washability in CMP is proposed (for example, JP-A No. 2003-142435), and a polishing composition that aims to prevent agglomeration of abrasive particles is proposed (for example, JP-A No. 2000-84832).

However, even in these polishing liquids, there is still no method for achieving a high polishing rate when polishing a barrier layer, while inhibiting scratching caused by the agglomeration of solid abrasive particles.

In order to improve insulation properties of wiring, low dielectric constant substrate materials (Low-k materials) are required to be developed in the future. However, Low-k materials are easily damaged by CMP and the insulation properties thereof may be seriously deteriorated by CMP. This problem is very serious when conventional polishing methods carried out in the acidic or alkaline region are used. Thus, a polishing liquid used in the pH neutral region has also been proposed (JP-A No. 2008-78233). It is hoped that this problem can be solved through use of the neutral region because a reactions tend not to occur in the neutral region.

However, there have been no methods that achieve a practical polishing rate with neutral polishing liquids. Since reactions tend not to occur in the neutral region, it is difficult to achieve a sufficient polishing rate for a barrier material and an insulating material. Therefore, the only method for increasing a polishing rate in the neutral region has been to increase the concentration of abrasive particles. However, when the concentration of the abrasive particles is increased to, for example, about 10% by mass in order to achieve a sufficient polishing rate, although the polishing rate improves, physical damage or defects are caused in the Low-k materials.

SUMMARY OF THE INVENTION

The present invention provides a polishing liquid including solid abrasive particles to polish a barrier layer consisting of a barrier metallic material and an insulating layer consisting of an insulating material, which can achieve a high polishing rate when polishing the barrier and insulating layers and can suppress the occurrence of scratching.

The present invention has been made in view of the above circumstances. The present invention includes the following aspects:

<1> A polishing liquid for a chemical mechanical polishing of a semiconductor device, the polishing liquid including:

(a) a carboxylic acid compound having one or more carboxy groups, (b) colloidal silica particles having a $\zeta$ potential of −10 mV to −35 mV when used in the polishing liquid, (c) a benzotriazole derivative, (d) an anionic surfactant, and (e) an oxidizing agent, the polishing liquid having a pH of from 5.0 to 8.0.

<2> The polishing liquid according to <1>, in which the concentration of (a) the carboxylic acid compound is in the range of from 0.5% by mass to 8% by mass.

<3> The polishing liquid according to <1> or <2>, in which (a) the carboxylic acid compound is at least one selected from the group consisting of acetic acid, glycolic acid, lactic acid, salicylic acid, iminodiacetate, nitrilotriacetic acid, ethylenediaminetetraacetic acid, diethylenetriamine pentaacetic acid, oxalic acid, malonic acid, succinic acid, malic acid, tartaric acid, citric acid, adipic acid and phthalic acid.

<4> The polishing liquid according to any one of <1> to <3>, in which the concentration of (b) the colloidal silica particles is in the range of from 0.5% by mass to 5% by mass with respect to the total amount of the polishing liquid.

<5> The polishing liquid according to any one of <1> to <4>, in which the primary average particle diameter of (b) the colloidal silica particles is in the range of from 10 nm to 100 nm.

<6> The polishing liquid according to any one of <1> to <5>, in which (c) the benzotriazole derivative is at least one selected from the group consisting of 1,2,3-benzotriazole, 5-methyl-1,2,3-benzotriazole, 5,6-dimethyl-1,2,3-benzotriazole, 5-carboxy-1,2,3-benzotriazole, and 5,6-dicarboxy-1,2,3-benzotriazole.

<7> The polishing liquid according to any one of <1> to <6>, in which (d) the anionic surfactant includes —COO— or —$SO_2$—O—.

<8> The polishing liquid according to any one of <1> to <7>, further including a polysaccharide.

<9> The polishing liquid according to <8>, in which the polysaccharide is at least one selected from the group consisting of pullulan, cellulose, agarose, pectin, starch, and derivatives thereof <10> A chemical mechanical polishing method of polishing a surface of a semiconductor device, including:

polishing the surface of the semiconductor device by relative movement of a polishing pad and the surface of the semiconductor device while supplying a polishing liquid to the polishing pad, the polishing liquid including:

(a) a carboxylic acid compound having one or more carboxy groups, (b) colloidal silica particles having a $\zeta$ potential of −10 mV to −35 mV when used in the polishing liquid, (c) a benzotriazole derivative, (d) an anionic surfactant, and (e) an oxidizing agent, the polishing liquid having a pH of from 5.0 to 8.0.

<11> The chemical mechanical polishing method according to <10>, wherein (a) the carboxylic acid compound is at least one selected from the group consisting of acetic acid, glycolic acid, lactic acid, salicylic acid, iminodiacetate, nitrilotriacetic acid, ethylenediaminetetraacetic acid, diethylenetriamine pentaacetic acid, oxalic acid, malonic acid, succinic acid, malic acid, tartaric acid, citric acid, adipic acid and phthalic acid.

According to the present invention, there is provided a polishing liquid including solid abrasive particles to polish a barrier layer consisting of a barrier metallic material and an insulating layer consisting of an insulating material, which can achieve a high polishing rate when polishing the barrier and insulating layers and can suppress the occurrence of scratching.

Since the polishing liquid of the present invention includes solid abrasive particles, a high polishing rate can be achieved when polishing the barrier layer. In addition, the occurrence of scratching can be suppressed, although the polishing liquid of the present invention includes solid abrasive particles.

DETAILED DESCRIPTION OF THE INVENTION

The polishing liquid of the present invention is used for polishing a barrier layer and an insulating layer of a semiconductor integrated circuit, the polishing liquid including:

(a) a carboxylic acid compound having one or more carboxy groups, (b) colloidal silica particles having a $\zeta$ potential of −10 mV to −35 mV in the polishing liquid, (c) a benzotriazole derivative, (d) an anionic surfactant, and (e) an oxidizing agent, and having a pH of from 5.0 to 8.0.

The polishing liquid of the present invention may optionally include other component(s).

The polishing liquid of the present invention has a pH in the neutral region, such as in the range of from pH 5.0 to pH 8.0. The fact that the pH is in the neutral region indicates that organic chemistry reactions, such as an oxidation-reduction reaction, a nucleophilic-electrophilic reaction or a dehydration reaction, substantially do not occur. Therefore, there are advantages in that, for example, the polishing liquid is friendly to the environment or the human body.

According to the present invention, a sufficient polishing rate can be achieved in the neutral region even when the concentration of abrasive particles is low, and damage to a substrate due to abrasive particles can be effectively suppressed. Thus, the invention provides a polishing liquid that can reduce damage or defects during physical or chemical polishing even with respect to Low-k materials, and that has substantially problem-free performance in practical use.

It is known that a surface of a barrier material or an insulating material to be polished is negatively charged. In the neutral region, the zeta potential ($\zeta$ potential) of the colloidal silica in the polishing liquid is similarly negatively charged. In conventionally-known polishing liquids, the $\zeta$ potential of colloidal silica in the neutral region is about −40 mV to −80 mV. In the case of such colloidal silica having a high negative ζ potential, efficient polishing cannot be achieved due to electrostatic repulsion between the colloidal silica and the surface to be polished. In the present invention, by focusing on the ζ potential of abrasive particles (colloidal silica), the ζ potential of the colloidal silica can be controlled by adjusting the components of the polishing liquid. When the ζ potential of the colloidal silica is highly negative, efficient polishing cannot be achieved. However, in contrast, the stability of the colloidal silica is impaired when the ζ potential is controlled to close to zero, which results in other problems such as agglomeration or settling of the abrasive particles. In the invention, however, by controlling the ζ potential of the colloidal silica in the polishing liquid to be in the range of from −10 mV to −35 mV, a polishing liquid that can achieve a sufficient polishing rate and that exhibits excellent stability over time can be provided.

Hereafter, the specific embodiments of the present invention will be explained.

The "polishing liquid" of the present invention includes not only the polishing liquid at the time of using in polishing (specifically, the polishing liquid that is diluted as required), but also includes a concentrated liquid of the polishing liquid. A concentrated liquid or a concentrated polishing liquid refers to a polishing liquid in which the concentration of a solute is regulated to a higher level than that of the polishing liquid when used in polishing, and is used by diluting with water or an aqueous solution at the time of polishing. The dilution rate is typically from 1 to 20 times in volume. Here, the expressions "concentrate" and "concentrated liquid" are used as the expressions that are conventionally used to stand for "condensate" or "condensed liquid", that is, a more concentrated state than the state when employed, rather than the meanings of general terminology accompanying a physical concentration process such as evaporation and the like.

Hereinafter, each component included in the polishing liquid of the invention will be described in detail.

(a) Carboxylic Acid Compound Having One or More Carboxy Groups

The polishing liquid of the present invention includes at least one (a) carboxylic acid compound having one or more carboxy groups. Here, the carboxylic acid compound functions as an oxidation promoter, a pH adjuster or a buffer, and not as a metal oxidant. Preferable examples of (a) the carboxylic acid compound for use in the present invention include a water-soluble carboxylic acid compound having 1 to 6 carboxy group(s) and a molecular weight of from 90 to 500. Specific examples thereof include a monocarboxylic acid compound such as acetic acid, glycolic acid, lactic acid or salicylic acid, or a compound represented by the following Formula (I).

$$HOOC—R—COOH \qquad (I)$$

In Formula (I), R represents a straight or branched alkylene group having 2 to 20 carbon atoms, alkynylene group, cycloalkylene group or arylene group, or a combination of two or more thereof.

Specific examples of the alkylene group having 2 to 20 carbon atoms represented by R include an ethylene group, a propylene group, a butylene group, a pentylene group, a hexylene group, a heptylene group and an octylene group. Among these, an ethylene group, a propylene group and a butylene group are preferable.

The alkynylene group represented by R is preferably an alkynylene group having 2 to 10 carbon atoms. Specific examples thereof include an ethynylene group and a propynylene group.

Specific examples of the cyclo alkylene group represented by R include a cyclohexylene group and a cyclopentylene group. Among these, a cyclohexylene group is preferable.

Specific examples of the arylene group represented by R include a phenylene group and a naphthylene group. Among these, a phenylene group is preferable.

Each group represented by R may further have a substituent. Examples of the substituent include a hydroxy group, an amino group, a carboxy group, a phosphate group, an imino group, a thiol group, a sulfo group and a nitro group.

Specific examples of the compound represented by Formula (I) include oxalic acid, malonic acid, succinic acid, isosuccinic acid, glutaric acid, adipic acid, pimelic acid, maleic acid, phthalic acid, isophthalic acid, terephthalic acid, malic acid, tartaric acid, citric acid, diglycolic acid, glutaric acid, acetoacetic acid, oxalacetic acid, 2,5-furandicarboxylic acid, or a mixture thereof. Among these, in order to achieve favorable selectivity, oxalic acid, malonic acid, succinic acid, glutaric acid, adipic acid, pimelic acid, maleic acid, phthalic acid, malic acid, tartaric acid, citric acid and diglycolic acid are preferable, and oxalic acid, malonic acid, succinic acid, malic acid, tartaric acid, citric acid, adipic acid and phthalic acid are more preferable.

As the carboxylic acid compound for use in the invention, in addition to the compounds represented by Formula (I), a compound having one carboxy group such as acetic acid, glycolic acid, lactic acid or salicylic acid, or a compound having two or more carboxy group such as iminodiacetate, nitrilotriacetic acid, ethylenediaminetetraacetic acid, or diethylenetriamine pentaacetic acid are preferable.

In the polishing liquid of the present invention, the carboxylic acid compound may be used singly or in combination of two or more thereof.

The content of the carboxylic acid compound in the polishing liquid is preferably from 0.5% by mass to 8% by mass, more preferably from 0.5% by mass to 6% by mass and still more preferably from 0.8% by mass to 5% by mass, with respect to the mass of the polishing liquid when used for polishing. More specifically, the content of the carboxylic acid compound is preferably 0.5% by mass or more in order to achieve a sufficient polishing rate, and preferably 8% by mass or less in order to maintain favorable flatness.

(b) Colloidal Silica Particles Having a ζ Potential of −10 mV to −35 mV in the Polishing Liquid The polishing liquid of the invention includes, as at least a part of abrasive particles, (b) the colloidal silica particles having a ζ potential of −10 mV to −35 mV in the polishing liquid (hereinafter, sometimes referred to as "specific colloidal silica particles").

The specific colloidal silica particles are preferably colloidal silica particles obtained by hydrolysis of alkoxy silane and including no impurity such as an alkali metal within the particulate. On the other hand, colloidal silica particles manufactured by eliminating alkali from an aqueous solution of alkali silicate may also be used. However, in such cases, the alkali metal remaining within the particulate may gradually elute, thereby adversely affecting the polishing performance. From this perspective, the colloidal silica obtained by the hydrolysis of alkoxy silane is more preferable as the raw material for the specific colloidal silica particles.

The specific colloidal silica particles have a ζ potential of −10 mV to −35 mV in the polishing liquid. The ζ potential of the specific colloidal silica particles is preferably from −20 mV to −35 mV, in consideration of achieving both sufficient polishing rate and storage stability.

Measurement of Zeta Potential (ζ Potential)

In the present invention, the zeta potential of colloidal silica particles in the polishing liquid is a value measured by the following method.

The zeta potential of the specific colloidal silica particles included in the obtained polishing liquid is measured in a non-concentrated state by DT-1200 provided by Nihon Rufuto Co., Ltd.

Examples of methods for adjusting the ζ potential of the colloidal silica particles in the polishing liquid to be in the range of from −10 mV to −35 mV include a method in which the pH of the polishing liquid is adjusted to the range specified in the invention, pH 5.0 to 8.0, by using a pH adjustor, and a method in which the ionic strength of a polishing liquid is adjusted by adding a given amount of an organic compound and/or an inorganic compound. Preferable examples of the pH adjustor include a base such as ammonia, sodium hydroxide or potassium hydroxide, and an acid such as sulfuric acid, hydrochloric acid or nitric acid. Examples of additives for adjusting the ionic strength include an organic compound such as (a) the carboxylic acid compounds having one or more carboxy groups, which is an essential component of the polishing liquid of the invention, and an inorganic compound such as a salt for use in a pH adjustor, for example, potassium nitrate, ammonium nitrate, sodium nitrate, potassium sulfate, ammonium sulfate, sodium sulfate, potassium chlorate, ammonium chlorate or sodium chlorate. In the present invention, it is preferable to use a combination of the above-described two methods in order to take advantages of neutrality. When only one of the above-described methods is used, the stability of abrasive particles may be impaired.

The primary average particle diameter of the specific colloidal silica particles can be appropriately selected according to the intended use thereof. In order to obtain a sufficient polishing rate while reducing polishing defects, the primary average particle diameter of the specific colloidal silica particles is preferably from 10 nm to 100 nm, and more preferably from 15 nm to 80 nm.

The primary average particle diameter of the invention is determined by observing 100 particles under SEM (scanning electron microscope), and averaging the minimum diameters of each particle.

The content (concentration) of the specific colloidal silica particles in the polishing liquid of the invention is preferably in the range of from 0.5% by mass to 5% by mass, more preferably from 1% by mass to 5% by mass, and still more preferably from 1.2% by mass to 4.5% by mass, with respect to the mass of the polishing liquid used in polishing. More specifically, the content of the specific colloidal silica particles is preferably 0.5% by mass or more in order to polish a barrier layer at a sufficient polishing rate, and is preferably 5% by mass or less in consideration of storage stability.

In the polishing liquid of the present invention, as long as the effects of the present invention are not adversely affected in any way, additional abrasive grains other than the specific colloidal silica particles may be used in combination. However, even in such cases, the amount of the specific colloidal silica particles with respect to the total amount of abrasive grains is preferably 50% by mass or more, and more preferably 80% by mass or more. Moreover, the abrasive grains may also be entirely comprised of the specific colloidal silica particles.

In the polishing liquid of the present invention, examples of the abrasive grains which can be used in combination of the specific colloidal silica include fumed-silica, ceria, alumina and titania.

The ζ potential of the additional abrasive grains in the polishing liquid is preferably negatively charged, in order to prevent aggregation of the abrasive grains. The average particle size of the additional abrasive grains is preferably equivalent to or greater than that of the specific colloidal silica particles, but is preferably no more than twice as large as that of the specific colloidal silica particles.

(c) Benzotriazole Derivative

The polishing liquid of the present invention includes (c) the benzotriazole derivative. (c) The benzotriazole derivative adsorbs to a surface to be polished and forms a film, thereby suppressing the corrosion of the surface of metal.

Examples of (c) the benzotriazole derivative include benzotriazole, 1,2,3-benzotriazole, 5-methyl-1,2,3-benzotriazole, 5,6-dimethyl-1,2,3-benzotriazole, 5-carboxy-1,2,3-benzotriazole, 5,6-dicarboxy-1,2,3-benzotriazole, 1-(1,2-dicarboxyethyl)benzotriazole, 1-[N,N-bis(hydroxyethyl) aminomethyl]benzotriazole and 1-(hydroxymethyl) benzotriazole. Among these, 1,2,3-benzotriazole, 5-methyl-1,2,3-benzotriazole, 5,6-dimethyl-1,2,3-benzotriazole, 5-carboxy-1,2,3-benzotriazole and 5,6-dicarboxy-1,2,3-benzotriazole are preferable.

The addition amount of (c) the benzotriazole derivative is preferably from 0.01% by mass to 0.2% by mass, and more preferably from 0.05% by mass to 0.2% by mass, with respect to the mass of the polishing liquid when used in polishing. More specifically, the addition amount of (c) the benzotriazole derivative is preferably 0.01% by mass or more in order to suppress the dishing, and preferably 0.2% by mass or less in consideration of storage stability.

(d) Anionic Surfactant

The polishing liquid of the present invention includes (d) the anionic surfactant. Preferable examples of (d) the anionic surfactant include a compound including —COO— or —$SO_2$—O—.

Specific examples of carboxylic acids and carboxylates that can be used as the anionic surfactant of the invention include fatty acid esters (for example, sodium tallowate, sodium stearate, potassium oleate, potassium castorate, a sodium salt of marseille ester, potassium myristate, potassium laurate, TEA laurate, potassium cocoate, and TEA cocoate), N-acyl amino acid esters (for example, triethanolamine-cocoyl sarcosinate, sodium cocoyl sarcosinate, sodium lauroyl sarcosinate, and sodium oleoyl sarcosinate), alkyl ether carboxylates (for example, polyoxyethylene/polyoxypropylene alkyl ether carboxylates, polyoxyethylene tridecyl ether carboxylate, and polyoxyethylene lauryl ether carboxylate), acylated peptides, polycarboxylic acid type high-molecular surfactants, gum rosin type disproportionated sodium rosinate, sodium rosinate, sodium rosinate denatured with maleic acid, di(mono)potassium alkenyl succinates, and alanine-based surfactants (for example, sodium cocoyl methyl-β-alanine, sodium lauroyl methyl-β-alanine, and sodium myristoyl methyl-β-alanine).

Among these anionic surfactants, fatty acid salts, N-acylamino acid salts, alkyl ether carboxylates, di(mono)potassium alkenyl succinates, and alanine-based surfactants are preferable in order to improve polishing rate and suppress the dishing.

Specific examples of sulfonic acids and sulfonates of anionic surfactants that can be used as the anionic surfactant of the invention include alkyl sulfonates (for example, dioctyl sulfosuccinate), alkylbenzene sulfonic acids (for example, dodecylbenzene sulfonic acid or a salt thereof), alkyl diphenyl ether disulfonates (for example, sodium alkyl diphenyl ether disulfonates), alkyl diphenyl ether monosulfonates (for example, sodium alkyl diphenyl ether monosulfonates), alkyl naphthalenesulfonates, alkyl sulfosuccinates (for example, sodium di-alkyl sulfosuccinates, disodium polyoxyethylene alkyl sulfosuccinates, sodium dialkyl sulfosuccinates and disodium lauryl sulfosuccinate), α-olefin sulfonates, and sulfates such as alkyl sulfates (for example, sodium lauryl sulfate, sodium higher-alcohol sulfates, triethanolamine-lauryl sulfate, and ammonium lauryl sulfate) and alkyl ether sulfates (for example, polyoxyethylene/polyoxypropylene alkyl ether sulfates and alkylamide sulfates), IGEPON T (trade name, manufactured by I.G. FARBENINDUSTRIE), IGEPON A (trade name, manufactured by I.G. FARBENINDUSTRIE), NECAL (trade name, manufactured by BASF A.G.), TAMOL (trade name, manufactured by BASF A.G.), N-acyl sulfonates, formaldehyde condensates of naphthalene or other aromatic sulfonates (for example, a formaldehyde condensate of sodium β-naphthalene sulfonate, and a formaldehyde condensate of sodium special aromatic sulfonate), sodium alkane sulfonates, isethionates such as cocoates (examples of a residue of cocoate generally include a lauryl group, a myristyl group, a palmityl group and a stearyl group), and sodium ethyl sulfonates.

Among these anionic surfactants, in order to improve polishing rate and suppress the dishing, alkylbenzene sulfonic acids, alkyl diphenyl ether sulfonates, alkyl sulfosuccinates, N-acyl sulfonates, alkyl sulfates, and polyoxyethylene alkyl ether sulfates are preferable.

The content of (d) the anionic surfactant in the polishing liquid of the invention is preferably from 0.00001 g to 10 g, more preferably from 0.00002 g to 7 g, and still more preferably from 0.00005 g to 6 g, with respect to 1 litter of the polishing liquid when used in polishing in order to improve polishing rate and suppress the dishing.

Other Surfactants

In addition to (d) the anionic surfactant, which is an essential component of the polishing liquid of the invention, the polishing liquid of the invention may optionally include other anionic surfactants, nonionic surfactants, cationic surfactants and/or amphoteric surfactant, as an optional component. Among these surfactants, cationic surfactants may form a precipitate depending on the pH of compositions. Therefore, it is necessary to select an appropriate cationic surfactant that does not form a precipitate according to the design of compositions for use.

Examples of nonionic surfactants include ether nonionic surfactants, ether/ester nonionic surfactants, ester nonionic surfactants, and nitrogen-containing nonionic surfactants. Specific examples of nonionic surfactants include ether nonionic surfactants such as a polyoxyalkylene alkyl ether, a polyoxyalkylene alkyl phenyl ether, polyoxyethylene derivatives (for example, polyoxyethylene disulfonated phenyl ether), polyoxyethylene polyoxypropylene glycol, an alkyl aryl formaldehyde-condensed polyoxyethylene ether, a polyoxyethylene-polyoxypropylene block polymer, and a polyoxyethylene polyoxypropylene alkyl ether.

Examples of ether/ester nonionic surfactants include a glyceryl ester of polyoxyethylene ether, a polyoxyethylene fatty acid ester, a polyoxyethylene sorbitan fatty acid ester, and a polyoxyethylene ether sorbitol ester. Examples of ester nonionic surfactants include a sorbitan fatty acid ester, a glycerin fatty acid ester, a polyglycerin ester, a sorbitan ester, a propylene glycol ester, and a sucrose ester. Examples of nitrogen-containing nonionic surfactants include a fatty acid alkanolamide, a polyoxyethylene alkylamine, and a polyoxyethylene alkylamide. Moreover, examples of nonionic surfactants include fluorosurfactants and acetylene-containing nonionic surfactants.

Examples of cationic surfactants include alkylamine salts (for example, cocamine acetate and stearylamine acetate), quaternary ammonium salts (for example, lauryl trimethyl ammonium chloride, stearyl trimethyl ammonium chloride, cetyl trimethyl ammonium chloride, distearyl dimethyl ammonium chloride, and alkyl benzyl dimethyl ammonium chloride), and alkylpyridinium salts (for example, cetylpyridinium chloride).

Examples of amphoteric surfactants include alkyl betaine amphoteric surfactants (for example, lauryl betaines (for example, dimethyllaurylaminoacetate betaine, stearyl betaine, and 2-alkyl-N-carboxymethyl-N-hydroxyethylimidazolium betaine), and amine oxide amphoteric surfactants (for example, lauryldimethylamine oxide).

The total content of surfactants in the polishing liquid of the invention is preferably from 0.00002 g to 10 g, more preferably from 0.00005 g to 7 g, and particularly preferably from 0.00005 g to 6 g, with respect to 1 litter of the polishing liquid when used in polishing. That is, the addition amount of surfactants is preferably 0.00002 g or more in order to obtain a sufficient effect, and is preferably 10 g or less in order to prevent decreasing of the CMP rate.

Here, the total content of surfactants means a sum total amount of the anionic surfactants, which is an essential component of the polishing liquid of the invention, and other surfactants that is used if necessary.

(e) Oxidizing Agent

The polishing liquid of the invention includes a compound capable of oxidizing the metal to be polished (oxidizing agent).

Examples of the oxidizing agent include hydrogen peroxide, a peroxide, a nitrate, an iodate, a periodate, a hypochlorite, a chlorite, a chlorate, a perchlorate, a persulfate, a dichromate, a permanganate and ozonated water. Among these, hydrogen peroxide is preferable. The oxidizing agent may be used singly or in combination of two or more kinds thereof.

The addition amount of (e) the oxidizing agent is preferably from 0.003 mol to 8 mol, more preferably from 0.03 mol to 6 mol, and still more preferably from 0.1 mol to 4 mol, with respect to 1 litter of the polishing liquid when used in polishing. That is, the addition amount of the oxidizing agent is preferably 0.003 mol or more in order to ensure sufficient metal oxidation and a high CMP rate, and preferably 8 mol or less in order to reduce roughness of a surface to be polished.

Other Components pH Adjuster

In the present invention, the pH of the polishing liquid is adjusted to be in the neutral region of from 5.0 to 8.0 to obtain favorable characteristics in terms of adsorption properties and reactivity with respect to a surface to be polished, the solubility of polishing metal, the electrochemical properties of a surface to be polished, the dissociation state of a functional group of a compound, the stability of a liquid and the like.

Although the pH of the polishing liquid of the invention may be in the range of from 5.0 to 8.0, in order to reduce damage to a Low-k film and to ensure stability over time, the pH of the polishing liquid is preferably from 6.5 to 8.0.

In order to regulate the pH to within the above-mentioned range, the polishing liquid of the invention preferably includes an alkali agent, an acid agent or a buffering agent.

In order to regulate the pH to within the above-mentioned preferable range, an alkali agent, acid agent or a buffering agent can be employed. The polishing liquid of the present invention achieves a sufficient effect when the pH is adjusted within the above-mentioned range.

Preferable examples of the alkali, acid or buffering agent include ammonia; an organic ammonium hydroxide such as ammonium hydroxide or tetramethyl ammonium hydroxide; a non-metallic alkali agent such as alkanol amines including diethanol amine, triethanol amine and triisopropanol amine; an alkali metal hydroxide such as sodium hydroxide, potassium hydroxide or lithium hydroxide; an inorganic acid such as nitric acid, sulfuric acid or phosphoric acid; a carbonate such as sodium carbonate; a phosphate such as trisodium phosphate; a borate, a tetraborate and a hydroxybenzoate. Among these, ammonium hydroxide, potassium hydroxide, lithium hydroxide and tetramethyl ammonium hydroxide are preferable.

The addition amount of the alkali, acid or buffering agent is not particularly limited as long as the pH of the polishing liquid is maintained within the desired range, and is preferably from 0.0001 mol to 1.0 mol, and more preferably from 0.003 mol to 0.5 mol, with respect to 1 liter of the polishing liquid when used in polishing.

Water-soluble Polymer

The polishing liquid of the invention may include a water-soluble polymer.

Examples of the water-soluble polymer include polysaccharides (for example, alginic acid, pectic acid, carboxymethylcellulose, agar, xanthan gum, chitosan, methyl glycol chitosan, methylcellulose, ethylcellulose, hydroxymethyl cellulose, hydroxyethyl cellulose, hydroxypropylcellulose, hydroxypropyl methylcellulose, carboxymethylcellulose, carboxyethylcellulose, and pullulan), polycarboxylic acids and derivatives thereof (for example, polyacrylic acid, polymethacrylic acid, polyaspartic acid, polyglutamic acid, polylysine, polymalic acid, polymaleic acid, polyitaconic acid, polyfumaric acid, poly(p-styrene carboxylic acid), polyvinyl sulfuric acid, polyaminoacrylamide, polyamic acid, and polyglyoxylic acid), polyethyleneimine, vinyl polymers (for example, polyvinyl alcohol, polyvinyl pyrrolidone, and polyacrolein), and polyglycols (for example, polyethylene glycol, polypropylene glycol, and polytetramethylene glycol). Preferable examples thereof include polysaccharides (for example, alginic acid, pectic acid, carboxymethylcellulose, agar, xanthan gum, chitosan, methyl glycol chitosan, methylcellulose, ethylcellulose, hydroxymethyl cellulose, hydroxyethyl cellulose, hydroxypropylcellulose, hydroxypropyl methylcellulose, carboxymethylcellulose, carboxyethylcellulose, and pullulan), polycarboxylic acids and derivatives thereof (for example, polyacrylic acid, polymethacrylic acid, polyaspartic acid, polyglutamic acid, polylysine, polymalic acid, polymaleic acid, polyitaconic acid, polyfumaric acid, polyp-styrene carboxylic acid), polyvinyl sulfuric acid, polyaminoacrylamide, polyamic acid, and polyglyoxylic acid), polyethyleneimine, and vinyl polymers (for example, polyvinyl alcohol, polyvinyl pyrrolidone, and polyacrolein).

Among these water-soluble polymers, polysaccharides are preferable. The polysaccharide is preferably a compound represented by the following Formula (3).

(3)

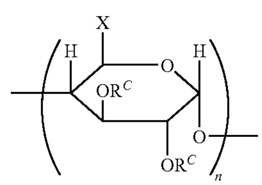

In Formula (3), $R^C$ represents a hydrogen atom or a carboxymethyl group. X represents a carboxy group, a carboxy alkyl group, a hydroxyalkyl group, —O—$CH_2$—$CO_2H$, or $CO_2M$. n represents an integer of 1 or more and M represents a metal atom.

M preferably represents a monovalent or a divalent metal, and more preferably K, Na or Ca.

When a substrate to be polished by the polishing liquid is a silicon substrate for a semiconductor integrated circuit or the like, contamination by an alkali metal, an alkaline earth metal and/or a halide is not desirable. Therefore, when the water-soluble polymer is in a form of an acid, it is preferable to use the water-soluble polymer in the form of the acid or to use the water-soluble polymer in the form of an ammonium salt.

The weight average molecular weight of the water-soluble polymer is preferably from 500 to 100,000, and more preferably from 2,000 to 50,000.

The water-soluble polymer of the invention can be used singly or in combination of two or more kinds thereof.

The addition amount of the water-soluble polymer is preferably from 0.001 g to 10 g, more preferably from 0.01 g to 5 g, and still more preferably from 0.1 g to 3 g, in total, with respect to llitter of the polishing liquid when used in polishing. That is, the addition amount of the water-soluble polymer is preferably 0.001 g or more in order to obtain sufficient effects, and is preferably 10 g or less in order to prevent decreasing of the CMP rate.

Chelating Agent

The polishing liquid of the present invention may optionally include a chelating agent (i.e., a water softener), in order to reduce adverse effects of a polyvalent metal ion contaminated in the polishing liquid.

Examples of the chelating agent include a general-purpose water softener or an analogous compound thereof, which is a calcium or magnesium precipitation inhibiting agent, such as nitrilotriacetic acid; diethylene triamine pentaacetic acid; ethylene diamine tetra-acetic acid; N,N,N-trimethylene phosphonic acid; ethylene diamine-N,N,N',N'-tetramethylene sulfonic acid; trans-cyclohexanediamine tetraacetic acid; 1,2-diaminopropane tetraacetic acid; glycol ether diamine tetraacetic acid; ethylenediamine ortho hydroxylphenylacetic acid; ethylene diamine succinic acid (SS); N-(2-carboxylate ethyl)-L-aspartic acid; β-alanine diacetic acid; 2-phosphonobutane-1,2,4-tricarboxylic acid; 1-hydroxyethylidene-1,1-diphosphonic acid; N,N'-bis(2-hydroxybenzyl) ethylenediamine-N,N'-diacetic acid; and 1,2-dihydroxybenezene-4,6-disulfonic acid.

As necessary, two or more kinds of chelating agents may be used in combination.

The adding amount of the chelating agent is not particularly limited as long as the amount is sufficient for sequestering metal ions such as polyvalent metal ions. The adding amount of the chelating agent is, for example, from 0.0003 mol to 0.07 mol, with respect to 1 liter of polishing liquid when used in polishing.

The polishing liquid of the present invention is typically suitable for polishing of a barrier layer composed of a barrier metal material for preventing copper diffusion, the barrier layer being placed between wiring composed of a copper metal and/or a copper alloy, and an inter-layer dielectric.

Barrier Metal Material

The material constituting the barrier layer, which is a surface to be polished by the polishing liquid of the present invention, is preferably a low resistance metal material and specific examples thereof include TiN, TiW, Ta, TaN, W and WN. Among these, Ta and TaN are preferable.

Inter-layer Dielectric

Examples of the inter-layer dielectric to be polished with the polishing liquid of the present invention include conventional inter-layer dielectrics such as those containing TEOS; and an inter-layer dielectric composed of a low dielectric material having a dielectric constant of as low as about 3.5 to 2.0 (for example, an organic polymer material, a SiOC compound, or a SiOF compound, which are generally referred to as a Low-k film).

Specific examples of the low dielectric material that can be used for forming an inter-layer dielectric include SiOC compounds such as HSG-R7 (trade name, manufactured by Hitachi Chemical Co., Ltd.) and BLACKDIAMOND (trade name, manufactured by Applied Materuals, Inc.).

Raw Material for Forming Wiring

The surface to be polished in the present invention preferably has wiring containing a copper metal and/or a copper alloy, such as one applied to semi-conductor devices including LSI chips. Specifically, copper alloys are preferable as the raw material for such wiring. Among the copper alloys, a copper alloy containing silver is preferable.

The amount of silver included in the copper alloy is preferably 40% by mass or less, more preferably 10% by mass or less, and even more preferably 1% by mass or less. The sufficient effects can be achieved when using the copper alloy containing silver at an amount of from 0.00001% by mass to 0.1% by mass.

Thickness of Wrings

When the substrate to be polished by the polishing liquid of the present invention is applied to DRAM devices, the wiring preferably has a thickness of, in half-pitch, 0.15 μm or less, more preferably 0.10 μm or less, and even more preferably 0.08 μm or less.

On the other hand, when the substrate to be polished by the polishing liquid is applied to micro processing unit (MPU) devices, the wiring preferably has a thickness of 0.12 μm or less, more preferably 0.09 μm or less, and even more preferably 0.07 μm or less.

The polishing liquid of the present invention exhibits sufficient effects to a surface having the above-described wiring.

Polishing Method

The polishing liquid of the invention may be:

(1) formed in the form of a concentrated solution, which is diluted by adding water or an aqueous solution in using;

(2) prepared by mixing below-described aqueous solutions respectively containing components of the polishing liquid, and diluting the mixed solution by adding water if necessary; or (3) formed in the form of a liquid that can be used as it is.

Any of the polishing liquids (1) to (3) may be used in the polishing method of the present invention.

The polishing method used in the invention is a method in which a polishing liquid is supplied onto a polishing pad placed on a polishing platen, the polishing pad is brought into contact with a surface to be polished, and the surface to be polished and polishing pad are moved relatively to each other.

A conventional polishing device having a holder for holding a substrate having a surface to be polished (for example, a wafer on which a film of conductive material is formed) and a polishing platen onto which a polishing pad is attached (equipped with a variable-speed motor and the like) may be used as the device used in polishing. The polishing pad that can be used in the invention is not particularly limited, and examples thereof include a conventional non-woven fabric, a polyurethane foam or a porous fluorocarbon resin.

The rotation speed of the polishing platen is not particularly limited, and is preferably 200 rpm or less, such that the substrate to be polished is deviated out from the platen. The contact pressure from the polishing pad to the substrate having the surface to be polished (a film to be polished) is preferably from 0.68 kPa to 34.5 kPa, and more preferably from 3.40 kPa to 20.7 kPa, in order to satisfy in-plane uniformity and pattern flatness of the substrate.

During polishing, the polishing liquid is continuously supplied onto the polishing pad by a pump or the like.

Once the polishing is completed, the polished substrate is washed thoroughly with running water, and then dried by removing the water droplets on the polished substrate with a spin drier or the like.

When diluting a concentrated liquid of the polishing liquid, as described in the method (1), the following aqueous solution can be used for diluting the concentrated solution. The aqueous solution is a solution in which at least one of an oxidizing agent, an organic acid, an additive, and a surfactant is dissolved in water in advance. Total components dissolved in the aqueous solution and in the concentrated liquid correspond to the components included in the resulting polishing liquid used in polishing (liquid for use).

Accordingly, when the polishing liquid is prepared by diluting a concentrated solution, components that do not readily dissolve can be separately prepared and add to the concentrated solution in the form of an aqueous solution. Consequently, a concentration liquid can be prepared to have an even higher degree of concentration.

The method of diluting the concentrated solution by adding water or an aqueous solution may be a method in which a pipe for supplying a concentrated polishing liquid and a pipe for supplying water or an aqueous solution are joined together in midstream, and thereby supplying a liquid for use of the polishing liquid that has been mixed and diluted onto the polishing pad. The mixing of the concentrated solution and the water or aqueous solution may be performed by a conventional method, such as: a method in which liquids are collision-mixed by allowing the liquids to pass through a narrow path while applying pressure; a method in which a filler, such as glass pipes, is packed within the pipes, and branching/separation and convergence of the liquid streams are repeated; and a method in which a vane that is revolved by force is provided within the pipes.

The supplying rate of the polishing liquid is preferably from 10 ml/min to 1000 ml/min, and more preferably from 170 ml/min to 800 ml/min, in order to satisfy in-plane uniformity and pattern flatness of the surface to be polished.

The method of polishing while diluting the concentrated solution with water or an aqueous solution may be a method in which the pipe supplying the polishing liquid and the pipe supplying water or the aqueous solution are separately provided, and predetermined amounts of the liquid and the water or aqueous solution is supplied onto the polishing pad from respective pipes, and polishing is carried out while mixing the liquid and the water or aqueous solution by means of the relative movement between the polishing pad and the surface to be polished. Furthermore, a polishing method may be a method in which predetermined amounts of the concentrated liquid and the water or aqueous solution are mixed in a single container, and then the mixture is supplied onto the polishing pad.

The polishing method may be a method in which the components which it to be included in the polishing liquid are divided into at least two component parts, and the component parts are diluted by adding water or an aqueous solution when used and supplied onto the polishing pad placed on the surface of the polishing platen, and then brought into contact with the surface to be polished, thereby performing polishing by relatively moving the surface to be polished and the polishing pad.

For example, the components may be divided in such a manner that an oxidizing agent is provided as component (A) and an organic acid, additive, surfactant and water are provided as component (B), and components (A) and (B) are diluted with water or an aqueous solution at the time of usage.

Alternatively, the additives having low solubility may be separated into components (A) and (B), for example, in such a manner that the oxidizing agent, additive, and surfactant are provided as component (A) and the organic acid, additive, surfactant, and water are provided as component (B), and components (A) and (B) are diluted with water or an aqueous solution at the time of usage.

In the above-described method, three pipes that respectively supply component (A), component (B), and water or an aqueous solution are required. The dilution and mixing may be carried out by a method in which the three pipes are joined to form a single pipe, from which the polishing liquid is supplied onto the polishing pad, and mixing is performed within the single pipe. In this case, two of the three pipes may be joined first, and then the last pipe is joined. Specifically, that the component containing the additive having low solubility and other components are mixed first, the mixture has then passed through a long distance to ensure enough time for the additive agent to dissolve, and water or an aqueous solution is supplied thereto.

The mixing methods also include a method in which three pipes are respectively lead to the polishing pad directly, and mixing is carried out while relatively moving the polishing pad and the surface to be polished; and a method in which three component parts are mixed in a single container, and then the mixture is diluted and supplied onto the polishing pad.

In the above-described polishing methods, the temperature of components may be regulated such that the temperature of the solution is at 40° C. or lower at the time of mixing a component including an oxidizing agent and other components or at the time of adding water or an aqueous solution to dilute, by regulating the temperature of the component including an oxidizing agent to be 40° C. or lower and by heating the other components to a temperature in the range of room temperature to 100° C. Since this method utilizes a phenomenon that the solubility is improved by increasing the temperature thereof, this method is effective for improving the solubility of the raw material having a low solubility in the polishing liquid.

The raw material included in the other components, which has been dissolved by heating to a temperature in the range of from room temperature to 100° C., may precipitate in the solution as the temperature decreases. Therefore, when the other components a low temperature state are used, pre-heating is required to dissolve the precipitated components. The heating can be achieved by applying a process in which the other components that have been heated to dissolve the raw material are delivered; or a process in which the liquid containing a precipitated material is agitated and then delivered, while the pipe is heated to dissolve the material. If the heated other components raise the temperature of the component including an oxidizing agent to 40° C. or more, the oxidizing agent may be degraded. Therefore, the temperature of the mixture of the component including the oxidizing agent and the other components is preferably 40° C. or less.

As mentioned above, in the present invention, the components of the polishing liquid may be divided into at least two component parts and supplied onto the surface to be polished. In such cases, it is preferable that the components are divided into a component including an oxide and a component containing an organic acid. It is also possible that the polishing liquid is provided as the concentrated solution, and water for dilution is separately supplied onto the surface to be polished.

Pad

The polishing pad that can be used in the polishing method of the present invention may be a pad having non-foam structure or may be a pad having a foam structure. The pad having non-foam structure may be a bulk of a hard synthetic-resin material, such as a plastic plate. Examples of the pad having a foam structure include three types of the pad: a closed-cell foam (dry type foam), an open-cell foam (wet type foam), and a two-layered structure (layered type). Among these, the two-layered structure (layered type) is preferable. The foaming may be either uniform or non-uniform.

Furthermore, the pad may include abrasive grains which are conventionally used in polishing (for example, ceria, silica, alumina, or a resin). The hardness of the pad may be either hard or soft. In the layered type, it is preferable that materials having a different hardness are used for each of the layers. The materials used in the pad are preferably non-woven fabric, artificial leather, polyamide, polyurethane, polyester, or polycarbonate. On the surface of the pad to be in contact with the surface to be polished, lattice grooves, holes, concentric grooves or helical grooves may be formed.

Wafer

The diameter of the wafer as the substrate to be polished in a CMP process using the polishing liquid of the present invention is preferably 200 mm or more, and more preferably 300 mm or more. When the diameter is 300 mm or more, sufficient effects can be obtained.

Polishing Device

A device for polishing using the polishing liquid of the present invention is not particularly limited, and examples of the device include MIRRA MESA CMP and REFLEXION CMP (both trade names, manufactured by Applied Materials, Inc.), FREX 200 and FREX 300 (both trade names, manufactured by Ebara Corporation), NPS 3301 and NPS 2301 (both trade names, manufactured by Nikon Corporation), A-FP-310A and A-FP-210A (both trade names, manufactured by Tokyo Seimitsu, Co., Ltd.), 2300 TERES (trade name, manufactured by Lam Research, Co., Ltd.) and MOMENTUM (trade name, manufactured by SpeedFam-IPEC, Inc.).

EXAMPLES

Hereinafter, the present invention will be explained in more detail with reference to the following Examples. However, the present invention is not specifically limited to the Examples.

Example 1

The following composition was mixed and a polishing liquid was prepared. A polishing experiment was conducted using thereof.

Composition for Polishing Liquid

| Component | Amount |
|---|---|
| Colloidal silica (particle diameter: 35 nm; PL3 slurry) | 150 g/L |
| Citric acid (manufactured by Wako Pure Chemical Industries, Ltd.) | 15 g/L |
| BTA (benzotriazole) | 1 g/L |
| Surfactant (PELEX SSL) | 1 g/L |

Pure water was added to bring the total volume of the polishing liquid to 1000 mL. The pH of the obtained polishing liquid was adjusted to 5.0 with aqueous ammonia and sulfuric acid.

Evaluation Method

The polishing of each wafer was conducted by using a polishing device LGP-612 (trade name, manufactured by Lapmaster), while supplying the polishing liquid under the following conditions. A wafer having Ta, TEOS, and a Low-k material (BLACK DIAMONDII BDIIXM, k value=2.4) films was used as a wafer to be polished.

After the polishing was completed, the polishing rate for each film and damage to the Low-k material (ratio of increase (in %) of the k value) were measured. The k value was evaluated based on a dielectric constant of the film calculated by the capacitance at 1 MHz determined using a mercury probe (manufactured by Four Dimensions Inc.) and a LCR meter (trade name: HP4285A, manufactured by Yokogawa Hewlett-Packard Company).

The polishing defects of the Low-k wafer after polishing were evaluated by counting the number of defects of the entire wafer surface (the number of defects each having a diameter of 0.20 μm or more was counted) using SP-1 (trade name, manufactured by KLA-Tencor Corporation.).

Polishing Condition

Number of table rotation: 64 rpm

Number of head rotation: 65 rpm

Polishing pressure: 13.79 kPa

Polishing pad: POLITEX PRIMA POLISHING PAD (trade name, manufactured by Rodel Nitta CO.)

polishing liquid supply rate: 200 ml/min

Examples 2 to 5 and Comparative Examples 1 and 2

Each of polishing liquids of Examples 2 to 5 and Comparative Examples 1 and 2 was prepared in a manner similar to Example 1, except that each component used in Example 1 was changed to a compound shown in Table 1. Each of the polishing liquids was evaluated in a manner similar to Example 1. The results are shown in Table 1.

In Tables 1 to 4, "RR" represents a polishing rate of each material of a wafer.

TABLE 1

| | Concentration of colloidal silica particles (particle diameter) | Carboxylic acid compound (content) | Benzo-triazole derivative (content) | Anionic surfactant (Content) | ζ potential of colloidal silica particles (mV) | pH | Ta RR (nm/min) | TEOS RR (nm/min) | Low-k RR (nm/min) | Ratio of increase of the K value after polishing (%) | Number of defects after polishing (pieces) |
|---|---|---|---|---|---|---|---|---|---|---|---|
| Ex. 1 | 3% (35 nm) | Citric acid (15 g/L) | BTA (1.0 g/L) | PELEX SSL (1.0 g/L) | −12 | 5.0 | 41 | 42 | 15 | 18 | 363 |
| Ex. 2 | 3% (35 nm) | Citric acid (15 g/L) | BTA (1.0 g/L) | PELEX SSL (1.0 g/L) | −16 | 6.0 | 40 | 37 | 10 | 16 | 285 |
| Ex. 3 | 3% (35 nm) | Citric acid (15 g/L) | BTA (1.0 g/L) | PELEX SSL (1.0 g/L) | −20 | 7.0 | 36 | 30 | 11 | 9 | 143 |
| Ex. 4 | 3% (35 nm) | Citric acid (15 g/L) | BTA (1.0 g/L) | PELEX SSL (1.0 g/L) | −25 | 7.5 | 39 | 35 | 10 | 10 | 92 |
| Ex. 5 | 3% (35 nm) | Citric acid (15 g/L) | BTA (1.0 g/L) | PELEX SSL (1.0 g/L) | −30 | 8.0 | 43 | 40 | 13 | 15 | 162 |
| Comp. Ex. 1 | 3% (35 nm) | Citric acid (15 g/L) | BTA (1.0 g/L) | PELEX SSL (1.0 g/L) | 5 | 3.0 | 51 | 50 | 20 | 28 | 652 |
| Comp. Ex. 2 | 3% (35 nm) | Citric acid (15 g/L) | BTA (1.0 g/L) | PELEX SSL (1.0 g/L) | −45 | 10.0 | 47 | 45 | 33 | 31 | 581 |

Ex.: Example,
Comp. Ex.: Comparative Example

As may be understood from Table 1, in Examples 1 to 5 in which the pH of the polishing liquid is in the range specified in the invention, the a smaller ratio of increase of the k value, and a smaller number of defects are observed without a decrease in the polishing rate.

In Comparative Example 1 in which the pH is 5 or lower, and Comparative Example 2 in which the pH is 8 or more, it is found that the ratio of increase of the k value is very high and there are a large number of defects.

Examples 6 to 37 and Comparative Examples 3 to 8

Each of polishing liquids of Examples 6 to 37 and Comparative Examples 3 to 8 was prepared in the same manner as in Example 1, except that each compound used in Example 1 was changed to a compound shown in Tables 2 to 4. Each of the polishing liquids was evaluated in a manner similar to Example 1. The results are shown in Tables 2 to 4.

TABLE 2

| | Concentration of colloidal silica particles (particle diameter) | Carboxylic acid compound (content) | Benzo-triazole derivative (content) | Anionic surfactant (Content) | Other compound (Content) | ζ potential of colloidal silica particles (mV) | pH | Ta RR (nm/min) | TEOS RR (nm/min) | Low-k RR (nm/min) | Ratio of increase of the K value after polishing (%) | Number of defects after polishing (pieces) |
|---|---|---|---|---|---|---|---|---|---|---|---|---|
| Ex. 6 | 3% (35 nm) | Citric acid (15 g/L) | BTA (1.0 g/L) | PELEX SSL (1.0 g/L) | Pullulan (1 g/L) | −22 | 7.5 | 51 | 45 | 12 | 12 | 185 |
| Ex. 7 | 4% (35 nm) | Acetic acid (20 g/L) | 5-MBTA (1.0 g/L) | EMAL 20T (2.0 g/L) | Gum arabic α (0.5 g/L) | −18 | 7.0 | 42 | 40 | 11 | 9 | 145 |

TABLE 2-continued

| | Concentration of colloidal silica particles (particle diameter) | Carboxylic acid compound (content) | Benzotriazole derivative (content) | Anionic surfactant (Content) | Other compound (Content) | ζ potential of colloidal silica particles (mV) | pH | Ta RR (nm/min) | TEOS RR (nm/min) | Low-k RR (nm/min) | Ratio of increase of the K value after polishing (%) | Number of defects after polishing (pieces) |
|---|---|---|---|---|---|---|---|---|---|---|---|---|
| Ex. 8 | 3% (35 nm) | EDTA (25 g/L) | 56-MBTA (1.0 g/L) | AKYPO RLM 45 (1.0 g/L) | Methyl-cellulose (0.2 g/L) | −25 | 7.5 | 49 | 48 | 10 | 11 | 178 |
| Ex. 9 | 3% (35 nm) | DTPA (25 g/L) | 5-MBTA (1.0 g/L) | ECT-3 (1.0 g/L) | — | −21 | 7.0 | 38 | 34 | 11 | 18 | 211 |
| Ex. 10 | 4% (35 nm) | Acetic acid (10 g/L) | BTA (1.0 g/L) | PELEX SSL (1.0 g/L) | Pullulan (0.3 g/L) | −24 | 7.5 | 47 | 39 | 9 | 6 | 126 |
| Ex. 11 | 4% (35 nm) | Citric acid (15 g/L) | BTA (1.0 g/L) | LATEMUL ASK (1.0 g/L) | Agarose (0.3 g/L) | −22 | 6.5 | 55 | 51 | 13 | 8 | 186 |
| Ex. 12 | 3% (35 nm) | Tartaric acid (15 g/L) | 5-CBTA (1.0 g/L) | ECT-7 (1.0 g/L) | Pullulan (1 g/L) | −26 | 7.5 | 46 | 46 | 14 | 11 | 148 |
| Ex. 13 | 3% (35 nm) | Phthalic acid (15 g/L) | 5-CBTA (1.0 g/L) | PELEX SSL (1.0 g/L) | SEROGEN FSB (0.8 g/L) | −21 | 7.0 | 43 | 45 | 10 | 14 | 165 |
| Ex. 14 | 3% (35 nm) | NTA (20 g/L) | 5-MBTA (1.0 g/L) | BEAULIGHT ESS (1.0 g/L) | Pullulan (1 g/L) | −20 | 7.5 | 47 | 42 | 11 | 13 | 178 |
| Ex. 15 | 3% (35 nm) | DTPA (25 g/L) | 5-MBTA (1.0 g/L) | AKYPO RLM 45 (1.0 g/L) | Pullulan (1 g/L) | −23 | 7.0 | 47 | 46 | 12 | 12 | 205 |
| Ex. 16 | 3% (35 nm) | Citric acid (15 g/L) | BTA (1.0 g/L) | ECT-3 (1.0 g/L) | — | −26 | 7.5 | 35 | 36 | 10 | 20 | 265 |
| Ex. 17 | 2.5% (35 nm) | Malonic acid (15 g/L) | 56-MBTA (1.0 g/L) | EMAL 20T (2.0 g/L) | VISGUM-N (0.5 g/L) | −25 | 7.5 | 43 | 45 | 10 | 13 | 178 |
| Ex. 18 | 3% (35 nm) | Acetic acid (20 g/L) | BTA (1.0 g/L) | PELEX SSL (1.0 g/L) | PENON-JE-66 (1 g/L) | −24 | 7.5 | 43 | 51 | 12 | 14 | 201 |
| Ex. 19 | 10% (35 nm) | Citric acid (15 g/L) | BTA (1.0 g/L) | PELEX SSL (1.0 g/L) | Pullulan (1 g/L) | −26 | 7.5 | 102 | 85 | 45 | 16 | 313 |

Ex.: Example

TABLE 3

| | Concentration of colloidal silica particles (particle diameter) | Carboxylic acid compound (content) | Benzotriazole derivative (content) | Anionic surfactant (Content) | Other compound (Content) | ζ potential of colloidal silica particles (mV) | pH | Ta RR (nm/min) | TEOS RR (nm/min) | Low-k RR (nm/min) | Ratio of increase of the K value after polishing (%) | Number of defects after polishing (pieces) |
|---|---|---|---|---|---|---|---|---|---|---|---|---|
| Ex. 20 | 3% (35 nm) | DTPA (25 g/L) | BTA (1.0 g/L) | NEOPELEX GS (0.5 g/L) | Pullulan (1 g/L) | −23 | 7.5 | 46 | 45 | 11 | 12 | 185 |
| Ex. 21 | 3% (35 nm) | Salicylic acid (15 g/L) | 5-MBTA (1.0 g/L) | PELEX SSL (1.0 g/L) | Sodium alginate (1 g/L) | −19 | 7.0 | 45 | 46 | 13 | 11 | 173 |
| Ex. 22 | 3% (35 nm) | Citric acid (15 g/L) | BTA (1.0 g/L) | LATEMUL ASK (1.0 g/L) | Gum arabic α (0.5 g/L) | −25 | 7.5 | 46 | 42 | 12 | 10 | 165 |
| Ex. 23 | 3% (35 nm) | Oxalic acid (15 g/L) | BTA (1.0 g/L) | ALANINATE LN 30 (1.0 g/L) | Pullulan (1 g/L) | −26 | 7.5 | 39 | 41 | 10 | 12 | 158 |
| Ex. 24 | 3% (35 nm) | Lactic acid (25 g/L) | BTA (1.0 g/L) | PELEX SSL (1.0 g/L) | Pullulan (1 g/L) | −25 | 7.5 | 45 | 45 | 9 | 11 | 175 |
| Ex. 25 | 3% (35 nm) | Malic acid (15 g/L) | 5-CBTA (1.0 g/L) | ECT-3 (1.0 g/L) | Carboxy-methyl cellulose (0.2 g/L) | −24 | 6.5 | 51 | 50 | 12 | 8 | 189 |

TABLE 3-continued

| | Concentration of colloidal silica particles (particle diameter) | Carboxylic acid compound (content) | Benzotriazole derivative (content) | Anionic surfactant (Content) | Other compound (Content) | ζ potential of colloidal silica particles (mV) | pH | Ta RR (nm/min) | TEOS RR (nm/min) | Low-k RR (nm/min) | Ratio of increase of the K value after polishing (%) | Number of defects after polishing (pieces) |
|---|---|---|---|---|---|---|---|---|---|---|---|---|
| Ex. 26 | 3% (35 nm) | Succinic acid (15 g/L) | 5-CBTA (1.0 g/L) | PELEX SSL (1.0 g/L) | Pullulan (1 g/L) | −23 | 7.5 | 45 | 45 | 11 | 9 | 195 |
| Ex. 27 | 3% (35 nm) | IDA (20 g/L) | BTA (1.0 g/L) | BEAULIGHT ESS (1.0 g/L) | SEROGEN FSB (0.8 g/L) | −21 | 7.5 | 51 | 46 | 12 | 14 | 185 |
| Ex. 28 | 3% (35 nm) | Glycolic acid (15 g/L) | BTA (1.0 g/L) | BEAULIGHT ESS (1.5 g/L) | Pullulan (1 g/L) | −26 | 7.5 | 55 | 43 | 13 | 13 | 178 |
| Ex. 29 | 3% (35 nm) | Citric acid (15 g/L) | 5-CBTA (1.0 g/L) | AKYPO RLM 45 (1.0 g/L) | Agarose (0.3 g/L) | −25 | 7.5 | 45 | 42 | 15 | 13 | 168 |
| Ex. 30 | 3% (35 nm) | Glycolic acid (25 g/L) | 5-MBTA (1.0 g/L) | PELEX SSL (1.0 g/L) | Pullulan (1 g/L) | −23 | 7.5 | 46 | 45 | 16 | 11 | 165 |
| Ex. 31 | 3% (35 nm) | Citric acid (15 g/L) | 5-MBTA (1.0 g/L) | NEOPELEX SSL (0.5 g/L) | Pectin (1 g/L) | −24 | 7.5 | 52 | 52 | 12 | 12 | 154 |
| Ex. 32 | 5% (35 nm) | Lactic acid (15 g/L) | 5-CBTA (1.0 g/L) | PELEX SSL (1.0 g/L) | Sodium alginate (1 g/L) | −25 | 7.5 | 65 | 56 | 11 | 10 | 193 |

Ex.: Example

TABLE 4

| | Concentration of colloidal silica particles (particle diameter) | Carboxylic acid compound (content) | Benzotriazole derivative (content) | Anionic surfactant (Content) | Other compound (Content) | ζ potential of colloidal silica particles (mV) | pH | Ta RR (nm/min) | TEOS RR (nm/min) | Low-k RR (nm/min) | Ratio of increase of the K value after polishing (%) | Number of defects after polishing (pieces) |
|---|---|---|---|---|---|---|---|---|---|---|---|---|
| Ex. 33 | 3% (35 nm) | Succinic acid (15 g/L) | 56-CBTA (1.0 g/L) | ALANINATE LN 30 (1.0 g/L) | — | −25 | 7.5 | 38 | 39 | 10 | 17 | 246 |
| Ex. 34 | 3% (35 nm) | Citric acid (15 g/L) | BTA (1.0 g/L) | PELEX SSL (1.0 g/L) | Pullulan (1 g/L) | −24 | 7.5 | 54 | 45 | 11 | 14 | 156 |
| Ex. 35 | 3% (35 nm) | Acetic acid (15 g/L) | 5-CBTA (1.0 g/L) | PELEX SSL (1.0 g/L) | PENON-JE-66 (1 g/L) | −23 | 7.5 | 52 | 43 | 12 | 12 | 185 |
| Ex. 36 | 3% (35 nm) | EDTA (25 g/L) | BTA (1.0 g/L) | ECT-3 (1.0 g/L) | Pullulan (1 g/L) | −25 | 7.5 | 51 | 42 | 13 | 11 | 145 |
| Ex. 37 | 3% (35 nm) | Citric acid (15 g/L) | BTA (1.0 g/L) | NEOPELEX GS (0.5 g/L) | VISGUM-N (0.5 g/L) | −24 | 7.5 | 48 | 41 | 15 | 10 | 185 |
| Comp. Ex. 3 | 3% (35 nm) | — | BTA (1.0 g/L) | PELEX SSL (1.0 g/L) | — | −68 | 7.5 | 8 | 1 | 8 | 6 | 120 |
| Comp. Ex. 4 | 3% (35 nm) | — | BTA (1.0 g/L) | PELEX SSL (1.0 g/L) | Pullulan (1 g/L) | −58 | 7.5 | 10 | 2 | 6 | 5 | 115 |
| Comp. Ex. 5 | 3% (35 nm) | Citric acid (0.15 g/L) | BTA (1.0 g/L) | PELEX SSL (1.0 g/L) | Pullulan (1 g/L) | −65 | 7.5 | 10 | 3 | 3 | 11 | 95 |
| Comp. Ex. 6 | 3% (35 nm) | Citric acid (100 g/L) | BTA (1.0 g/L) | PELEX SSL (1.0 g/L) | Pullulan (1 g/L) | −5 | 7.5 | 51 | 55 | 25 | 15 | >5000 |
| Comp. Ex. 7 | 3% (35 nm) | Citric acid (15 g/L) | BTA (1.0 g/L) | PELEX SSL (1.0 g/L) | Pullulan (1 g/L) | −35 | 10.5 | 65 | 56 | 45 | 32 | 1256 |
| Comp. Ex. 8 | 3% (35 nm) | Citric acid (15 g/L) | BTA (1.0 g/L) | — | Pullulan (1 g/L) | −26 | 7.5 | 54 | 56 | 65 | 25 | 856 |

Ex.: Example,
Comp. Ex.: Comparative Example

The compounds given in abbreviation in Tables 1 to 4 are as follows.

Polycarboxylic Acid Compound

IDA: Iminodiacetic acid

EDTA: Ethylenediaminetetraacetic acid

DTPA: Diethylenetriaminepentaacetic acid

NTA: Nitrilotriacetic acid

Benzotriazole Derivative

BTA: 1,2,3-benzotriazole

5-MBTA: 5-methyl-1,2,3-benzotriazole

56-MBTA: 5,6-dimethyl-1,2,3-benzotriazole

5-CBTA: 5-carboxy-1,2,3-benzotriazole

56-CBTA: 5,6-dicarboxy-1,2,3-benzotriazole

Anionic Surfactant

PELEX SSL(trade name, manufactured by Kao Corporation): Sodium alkyl diphenyl ether disulfonate EMAL 20T (trade name, manufactured by Kao Corporation): Triethanolamine polyoxyethylene alkyl ether sulfate NEOPELEX GS (trade name, manufactured by Kao Corporation): Dodecylbenzene sulfonic acid (soft type)

LATEMUL ASK (trade name, manufactured by Kao Corporation): Dipotassium alkenyl succinate ECT-3 (trade name, manufactured by Nikko Chemicals. Co., Ltd.): Polyoxyethylene tridecyl ether acetate ECT-7 (trade name, manufactured by Nikko Chemicals. Co., Ltd.): Polyoxyethylene tridecyl ether acetate AKYPO RLM45 (trade name, manufactured by Nikko Chemicals. Co., Ltd.): Polyoxyethylene lauryl ether carboxylic acid ALANINATE LN-30 (trade name, manufactured by Nikko Chemicals. Co., Ltd.): Aqueous sodium lauroyl methylaminopropionate BEAULIGHT ESS (trade name, manufactured by Sanyo Chemical Industries): Disodium polyoxyethylene alkyl sulfosuccinate BEAULIGHT LSS (trade name, manufactured by Sanyo Chemical Industries): Disodium lauryl polyoxyethylene sulfosuccinate Other Compound Pullulan: (manufactured by Tokyo Chemical Industry Co., Ltd.)

Gum arabic α: (manufactured by TIC Gums Inc.)

CELLOGEN FSB: Carboxymethylcellulose (manufactured Daiichi Kogyo Seiyaku Co., Ltd.)

Pectin: (manufactured by Wako Pure Chemical Industries, Ltd.)

Agarose: (manufactured by Wako Pure Chemical Industries, Ltd.)

VISGUM-N: starch (manufactured by Nippon Starch Chemical Co., Ltd.)

PENON JE-66: starch (manufactured by Nippon Starch Chemical Co., Ltd.)

As may be understood from Tables 2 to 4, the polishing liquids of Examples 6 to 37, which are within the range of the present invention, exhibit a sufficient polishing rate for various wafers, and favorable results in that the number of defects in the Low-k wafers after polishing is small. In contrast, in Comparative Examples 3 and 4, which are free from carboxylic acid compounds, and Comparative Example 5, in which the C potential of colloidal silica particles is −35 mV or lower, polishing rates for various wafers are low. In addition, in Comparative Example 6, in which the ζ potential of colloidal silica particles is −10 mV or more, there was a large number of defects. In Comparative Example 7, having a pH of 8 or more, and Comparative Example 8, which does not include an anionic surfactant, the polishing rate for each wafer was high, but there were also a large number of defects. Therefore, it can be seen that sufficient polishing rates cannot be achieved, and many defects occur after polishing when a polishing liquid out of the range of the present invention is used.

All publications, patent applications, and technical standards mentioned in this specification are herein incorporated by reference to the same extent as if each individual publication, patent application, or technical standard was specifically and individually indicated to be incorporated by reference.

What is claimed is:

1. A polishing liquid for a chemical mechanical polishing of a semiconductor device, the polishing liquid comprising:

(a) a carboxylic acid compound having one or more carboxy groups, (b) colloidal silica particles having a ζ potential of −12 mV to −26 mV when used in the polishing liquid, (c) a benzotriazole derivative, (d) an anionic surfactant, and (e) an oxidizing agent, the polishing liquid having a pH of from 5.0 to 8.0.

2. The polishing liquid according to claim 1, wherein the concentration of (a) the carboxylic acid compound is in the range of from 0.5% by mass to 8% by mass.

3. The polishing liquid according to claim 1, wherein (a) the carboxylic acid compound is at least one selected from the group consisting of acetic acid, glycolic acid, lactic acid, salicylic acid, iminodiacetate, nitrilotriacetic acid, ethylenediaminetetraacetic acid, diethylenetriamine pentaacetic acid, oxalic acid, malonic acid, succinic acid, malic acid, tartaric acid, citric acid, adipic acid and phthalic acid.

4. The polishing liquid according claim 1, wherein the concentration of (b) the colloidal silica particles is in the range of from 0.5% by mass to 5% by mass with respect to the total amount of the polishing liquid.

5. The polishing liquid according to claim 1, wherein the primary average particle diameter of (b) the colloidal silica particles is in the range of from 10 nm to 100 nm.

6. The polishing liquid according to claim 1, wherein (c) the benzotriazole derivative is at least one selected from the group consisting of 1,2,3-benzotriazole, 5-methyl-1,2,3-benzotriazole, 5,6-dimethyl-1,2,3-benzotriazole, 5-carboxy-1,2,3-benzotriazole, and 5,6-dicarboxy-1,2,3-benzotriazole.

7. The polishing liquid according to claim 1, wherein (d) the anionic surfactant comprises —COO— or —$SO_2$—O—.

8. The polishing liquid according to claim 1, further comprising a polysaccharide.

9. The polishing liquid according to claim 8, wherein the polysaccharide is at least one selected from the group consisting of pullulan, cellulose, agarose, pectin, starch, and derivatives thereof.

10. A chemical mechanical polishing method of polishing a surface of a semiconductor device, comprising: polishing the surface of the semiconductor device by relative movement of a polishing pad and the surface of the semiconductor device while supplying a polishing liquid to the polishing pad, the polishing liquid comprising: (a) a carboxylic acid compound having one or more carboxy groups, (b) colloidal silica particles having a ζ potential of −12 mV to −26 mV when used in the polishing liquid, (c) a benzotriazole derivative, (d) an anionic surfactant, and (e) an oxidizing agent, the polishing liquid having a pH of from 5.0 to 8.0.

11. The chemical mechanical polishing method according to claim 10, wherein (a) the carboxylic acid compound is at least one selected from the group consisting of acetic acid, glycolic acid, lactic acid, salicylic acid, iminodiacetate, nitrilotriacetic acid, ethylenediaminetetraacetic acid, diethylenetriamine pentaacetic acid, oxalic acid, malonic acid, succinic acid, malic acid, tartaric acid, citric acid, adipic acid and phthalic acid.

12. A polishing liquid for a chemical mechanical polishing of a semiconductor device, the polishing liquid comprising:

(a) a carboxylic acid compound having one or more carboxy groups, (b) colloidal silica particles containing no impurity and having a ζ potential of −12 mV to −26 mV when used in the polishing liquid, (c) a benzotriazole derivative, (d) an anionic surfactant, and (e) an oxidizing agent, the polishing liquid having a pH of from 5.0 to 8.0.

13. The polishing liquid according to claim 12, wherein (a) the carboxylic acid compound is at least one selected from the group consisting of acetic acid, glycolic acid, lactic acid, salicylic acid, iminodiacetate, nitrilotriacetic acid, ethylenediaminetetraacetic acid, diethylenetriamine pentaacetic acid, oxalic acid, malonic acid, succinic acid, malic acid, tartaric acid, citric acid, adipic acid and phthalic acid.

14. The polishing liquid according to claim 12, wherein (c) the benzotriazole derivative is at least one selected from the group consisting of 1,2,3-benzotriazole, 5-methyl-1,2,3-benzotriazole, 5,6-dimethyl-1,2,3-benzotriazole, 5-carboxy-1,2,3-benzotriazole, and 5,6-dicarboxy-1,2,3-benzotriazole.

15. The polishing liquid according to claim 12, wherein (d) the anionic surfactant comprises —COO— or —$SO_2$—O—.

16. The polishing liquid according to claim 12, further comprising a polysaccharide.

* * * * *